(12) United States Patent
Kang et al.

(10) Patent No.: US 12,002,798 B2
(45) Date of Patent: Jun. 4, 2024

(54) FAN-OUT TYPE SEMICONDUCTOR PACKAGE AND METHOD OF MANUFACTURING THE SAME

(71) Applicant: SAMSUNG ELECTRONICS CO., LTD., Suwon-si (KR)

(72) Inventors: Myungsam Kang, Hwaseong-si (KR); Youngchan Ko, Seoul (KR); Yongjin Park, Yongjin-si (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 17/861,359

(22) Filed: Jul. 11, 2022

(65) Prior Publication Data
US 2022/0344319 A1 Oct. 27, 2022

Related U.S. Application Data

(63) Continuation of application No. 16/989,239, filed on Aug. 10, 2020, now Pat. No. 11,387,225.

(30) Foreign Application Priority Data

Jan. 2, 2020 (KR) .......................... 10-2020-0000056

(51) Int. Cl.
*H01L 25/065* (2023.01)
*H01L 25/18* (2023.01)

(52) U.S. Cl.
CPC .......... *H01L 25/18* (2013.01); *H01L 25/0657* (2013.01); *H01L 2225/06524* (2013.01); *H01L 2225/06548* (2013.01)

(58) Field of Classification Search
CPC ................. H01L 25/0657; H01L 25/18; H01L 2225/06524
See application file for complete search history.

(56) References Cited

U.S. PATENT DOCUMENTS 8,354,297 B2  1/2013  Pagaila et al.
9,773,757 B2  9/2017  Yu et al.
(Continued)

FOREIGN PATENT DOCUMENTS

KR  10-2011-0032522    3/2011
KR     20180071476 A    6/2018
KR  10-2018-0080071    7/2018

OTHER PUBLICATIONS

Office Action in Korean Appln. No. 10-2020-0000056, mailed on Feb. 15, 2024, 12 pages (with English translation).

*Primary Examiner* — Dale E Page
*Assistant Examiner* — Ilner Jean Baptiste
(74) *Attorney, Agent, or Firm* — Fish & Richardson P.C.

(57) ABSTRACT

A fan-out type semiconductor package may include a frame, an upper chip stack, a first redistribution pattern, a lower chip stack, a second redistribution pattern and a redistribution post. The frame may have a cavity. The upper chip stack may be arranged in the cavity. The first redistribution pattern may be arranged under the frame. The first redistribution pattern may be electrically connected with the upper chip stack. The lower chip stack may be arranged under the first redistribution pattern. The second redistribution pattern may be arranged under the lower chip stack. The second redistribution pattern may be electrically connected with the lower chip stack. The redistribution post may be electrically connected between the first redistribution pattern and the second redistribution pattern. Thus, the fan-out type semiconductor package may have an improved heat dissipation characteristic with a thin thickness.

9 Claims, 10 Drawing Sheets

(56) References Cited

U.S. PATENT DOCUMENTS

| | | | |
|---|---|---|---|
| 9,806,059 B1 | 10/2017 | Lee et al. | |
| 10,199,312 B1 * | 2/2019 | Rivera-Marty | H01L 24/81 |
| 10,325,879 B2 | 6/2019 | Yu et al. | |
| 11,069,601 B2 * | 7/2021 | Arellano | H01L 23/3121 |
| 2003/0042153 A1 | 3/2003 | Farrar et al. | |
| 2006/0284299 A1 | 12/2006 | Karnezos | |
| 2010/0133665 A1 | 6/2010 | Ha et al. | |
| 2011/0068481 A1 | 3/2011 | Park et al. | |
| 2012/0056316 A1 | 3/2012 | Pagaila et al. | |
| 2015/0206866 A1 | 7/2015 | Yu et al. | |
| 2018/0138083 A1 | 5/2018 | Kim et al. | |
| 2018/0190591 A1 | 7/2018 | Kim et al. | |
| 2019/0287924 A1 | 9/2019 | Moon et al. | |

\* cited by examiner

FAN-OUT TYPE SEMICONDUCTOR PACKAGE AND METHOD OF MANUFACTURING THE SAME

CROSS-RELATED APPLICATION

This is a Continuation of U.S. application Ser. No. 16/989,239, filed Aug. 10, 2020, and a claim of priority is made to Korean Patent Application No. 10-2020-0000056, filed on Jan. 2, 2020 in the Korean Intellectual Property Office (KIPO), the contents of which are herein incorporated by reference in their entirety.

BACKGROUND

Example embodiments relate to a fan-out type semiconductor package and a method of manufacturing the same. More particularly, example embodiments relate to a fan-out type semiconductor package that may, for example, be used in a smart phone, and a method of manufacturing such a fan-out type semiconductor package.

In smart phone and similar applications, a package-on-package (POP) device may be used in which an upper package of the POP device includes memory chips and a lower package of the POP device includes a logic chip. The memory chips may be electrically connected with an upper package substrate of the upper package via conductive wires. The POP device may be relatively thick since the conductive wires may be molded by a molding member. In order to reduce the thickness of the POP device, the thickness of the logic chip may be decreased. However, reducing the thickness of the logic chip can disadvantageously result in a reduced capability of the POP device to sufficiently dissipate heat.

SUMMARY

According to example embodiments, there may be provided a fan-out type semiconductor package. The fan-out type semiconductor package may include a frame, an upper chip stack, a first redistribution pattern, a lower chip stack, a second redistribution pattern, and a redistribution post. The frame may have a cavity. The upper chip stack may be arranged in the cavity. The first redistribution pattern may be arranged under the frame. The first redistribution pattern may be electrically connected with the upper chip stack. The lower chip stack may be arranged under the first redistribution pattern. The second redistribution pattern may be arranged under the lower chip stack. The second redistribution pattern may be electrically connected with the lower chip stack. The redistribution post may be electrically connected between the first redistribution pattern and the second redistribution pattern.

According to example embodiments, there may be provided a fan-out type semiconductor package. The fan-out type semiconductor package may include a frame, an upper chip stack, a first redistribution pattern, a first upper post, a second upper post, an upper molding member, a lower chip stack, a second redistribution pattern, a first lower post, a second lower post, a redistribution post, and a lower molding member. The frame may have a cavity. The upper chip stack may include a first upper chip and a second upper chip. The first upper chip may be arranged in the cavity. The second upper chip may be stacked on an upper surface of the first upper chip in a step-like shape. The second upper chip may have a size substantially the same as a size of the first upper chip. An edge portion of the first upper chip, which may not be overlapped with the second upper chip, may be exposed. An edge portion of the second upper chip, which may not be overlapped with the first upper chip, may be exposed. The first upper chip may include a first upper pad arranged on a region of a lower surface of the exposed portion of the first upper chip. The second upper chip may include a second upper pad arranged on a region of a lower surface of the exposed portion of the second upper chip. The first redistribution pattern may be arranged under the frame. The first upper post may be downwardly extended from the first upper pad. The first upper post may be connected to the first redistribution pattern. The second upper post may be downwardly extended from the second upper pad. The second upper post may be connected to the first redistribution pattern. The upper molding member may be formed on the first redistribution pattern to support the upper chip stack and the first and second upper posts. The lower chip stack may include a first lower chip and a second lower chip. The first lower chip may be arranged under the first redistribution pattern. The second lower chip may be stacked on an upper surface of the first lower chip in a step-like shape. The second lower chip may have a size substantially the same as a size of the first lower chip. An edge portion of the first lower chip, which may not be overlapped with the second lower chip, may be exposed. An edge portion of the second lower chip, which may not be overlapped with the first lower chip, may be exposed. The first lower chip may include a first lower pad arranged on a region of a lower surface of the exposed portion of the first lower chip. The second lower chip may include a second lower pad arranged on a region of a lower surface of the exposed portion of the second lower chip. The second redistribution pattern may be arranged under the lower chip stack. The first lower post may be downwardly extended from the first lower pad. The first lower post may be connected to the second redistribution pattern. The second lower post may be downwardly extended from the second lower pad. The second lower post may be connected to the second redistribution pattern. The redistribution post may be electrically connected between the first redistribution pattern and the second redistribution pattern. The lower molding member may be formed on the second redistribution pattern to support the lower chip stack, the first and second upper posts, and the redistribution post.

According to example embodiments, there may be provided a method of manufacturing a fan-out type semiconductor package. In the method of manufacturing the fan-out type semiconductor package, an upper chip stack may be arranged in a cavity of a frame. A first redistribution pattern electrically connected with the upper chip stack may be formed under the frame. A lower chip stack may be arranged under the first redistribution pattern. A second redistribution pattern electrically connected with the lower chip stack may be formed under the lower chip stack. A redistribution post may be electrically connected between the first redistribution pattern and the second redistribution pattern.

According to example embodiments, the upper chip stack may be arranged in the cavity of the frame in the step-like shape and the step-like lower chip stack may also be arranged under the upper chip stack. Thus, the fan-out type semiconductor package may have an improved heat dissipation characteristic with a thin thickness.

BRIEF DESCRIPTION OF THE DRAWINGS

Example embodiments will be more clearly understood from the following detailed description taken in conjunction with the accompanying drawings, in which.

DETAILED DESCRIPTION OF THE EMBODIMENTS

Hereinafter, example embodiments will be explained in detail with reference to the accompanying drawings.

Figure 1:
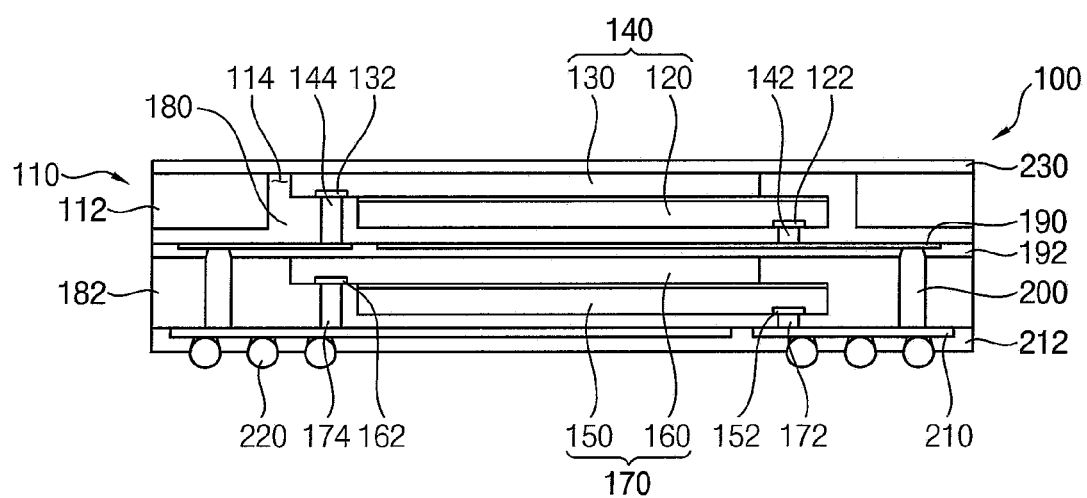
FIG. 1 is a cross-sectional view illustrating a fan-out type semiconductor package in accordance with example embodiments.

FIG. 1 is a cross-sectional view illustrating a fan-out type semiconductor package in accordance with example embodiments.

Referring to FIG. 1, a fan-out type semiconductor package 100 of example embodiments may include a frame 110, an upper chip stack 140, an upper molding member 180, a first redistribution pattern 190, a lower chip stack 170, a lower molding member 182, a second redistribution pattern 210, a redistribution post 200 and external terminals 220.

The frame 110 may include a core insulation layer 112 and a cavity 114. The cavity 114 may be formed through a central portion of the core insulation layer 112 in a vertical direction.

The upper chip stack 140 may be arranged in the cavity 114. The upper chip stack 140 may include a first upper chip 120 and a second upper chip 130. The second upper chip 130 may be stacked on an upper surface of the first upper chip 120. The first and second upper chips 120 and 130 may include memory chips.

The first upper chip 120 may include a plurality of first upper pads 122. The first upper pads 122 may be arranged on a lower surface of the first upper chip 120. The second upper chip 130 may include a plurality of second upper pads 132. The second upper pads 132 may be arranged on a lower surface of the second upper chip 130.

In example embodiments, the first upper chip 120 may have a size which may be substantially the same as a size of the second upper chip 130. Thus, the first upper chip 120 may have a surface area and a thickness which may be substantially the same as a surface area and a thickness of the second upper chip 130. Alternatively, in other embodiments, the first upper chip 120 may have a surface area and/or a thickness which may be different from a surface area and a thickness of the second upper chip 130.

Further, the first upper chip 120 may have a lower surface which may be substantially coplanar in a horizontal plane with a lower surface of the frame 110. The second upper chip 130 may have an upper surface substantially coplanar in a horizontal plane with an upper surface of the frame 110. Alternatively, the lower surface of the first upper chip 120 may be positioned on a horizontal plane that may be different from a horizontal plane on which the lower surface of the frame 110 may be positioned. That is, the lower surface of the first upper chip 120 may be positioned on a horizontal plane that may be higher or lower than a horizontal plane on which the lower surface of the frame 110 may be positioned. Further, the upper surface of the second upper chip 130 may be positioned on a horizontal plane that may be different from a horizontal plane on which the upper surface of the frame 110 may be positioned. That is, the upper surface of the first upper chip 130 may be positioned on a horizontal plane that may be higher or lower than the horizontal plane on which the upper surface of the frame 110 may be positioned.

Figure 2A:
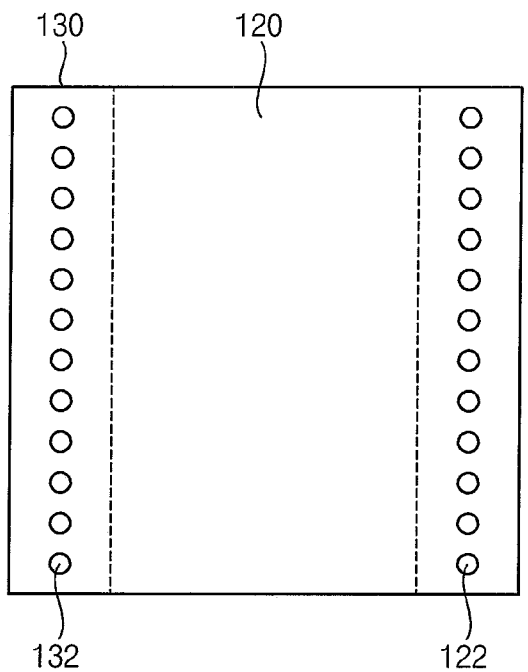
FIGS. 2A and 2B are bottom views illustrating stack configurations of an upper chip stack of the fan-out type semiconductor package shown in FIG. 1.
Figure 2B:
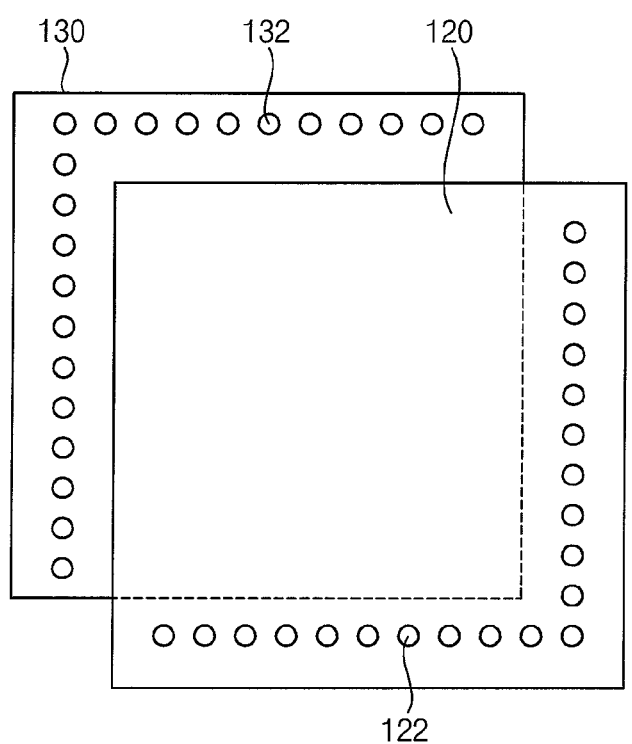

FIGS. 2A and 2B are bottom views illustrating stack configurations of the upper chip stack 140 of the fan-out type semiconductor package shown in FIG. 1.

Referring to FIG. 2A, in one example the first upper pads 122 may be arranged adjacent one edge only of the first upper chip 120, and the second upper pads 132 may be arranged adjacent one edge only of the second upper chip 130. In addition, the second upper chip 130 may be stacked on the first upper chip 120 in a laterally offset manner so as to downwardly expose the second upper pads 132. As a result, the upper chip stack 140 has a step-like shape. In addition, the orientation of the first upper chip 120 may be rotated 180° relative to that of the second upper chip 130 such that the first upper pads 122 may be located along an opposite edge of the upper chip stack 140 relative to the second upper pads 132.

Referring to FIG. 2B, in another example the first upper pads 122 may be arranged adjacent two connecting edges only of the first upper chip 120, and the second upper pads 132 may be arranged adjacent two connecting edges only of the second upper chip 130. In addition, the second upper chip 130 may be stacked on the first upper chip 120 in a diagonally offset manner so as to downwardly expose the second upper pads 132. As a result, the upper chip stack 140 has a corner step-like shape. In addition, the orientation of the first upper chip 120 may be rotated 180° relative to that of the second upper chip 130 such that the first upper pads 122 may be located along an opposite corner of the upper chip stack 140 relative to the second upper pads 132.

In the example embodiments of FIGS. 2A and 2B, the upper chip stack 140 includes a stack of two chips 120 and 130. In alternative embodiments, the upper chip stack 140 includes three or more stacked chips.

Referring again to FIG. 1, a first upper post 142 may be downwardly extended from the first upper pads 122 of the first upper chip 120. The first upper post 142 may be formed by a plating process. In example embodiments, the first upper post 142 may include a metal such as copper.

A second upper post 144 may be downwardly extended from the second upper pads 132 of the second upper chip 130. The second upper post 144 may have a lower end substantially coplanar with a lower end of the first upper post 142. The second upper post 144 may be formed by a plating process. In example embodiments, the second upper post 144 may include a metal such as copper.

The upper molding member 180 may be formed on the lower surface of the frame 110 to fill up the cavity 114. Thus, the upper molding member 180 may be configured to surround the first and second upper chips 120 and 130 and the first and second upper posts 142 and 144. The lower ends of the first and second upper posts 142 and 144 may be exposed through a lower surface of the upper molding member 180.

A first insulation layer 192 may be formed on the lower surface of the upper molding member 180. The first insulation layer 192 may include a photoimageable dielectric (PID). The first redistribution pattern 190 may be formed in the first insulation layer 192. The first redistribution pattern 190 may be extended to a fan-out region beyond the upper chip stack 140. The first redistribution pattern 190 may include an upper end exposed through an upper surface of the first insulation layer 192 and a lower end exposed through a lower surface of the first insulation layer 192. The lower ends of the first and second upper posts 142 and 144 may be connected to the upper end of the first redistribution pattern 190 exposed through the upper surface of the first insulation layer 192.

In example embodiments, the first insulation layer 192 and the first redistribution pattern 190 may have a single-layered structure. Alternatively, the first insulation layer 192 and the first redistribution pattern 190 may have a multi-layered structure.

The lower chip stack 170 may be arranged in the lower surface of the first insulation layer 192. The lower chip stack 170 may include a first lower chip 150 and a second lower chip 160. The first and second lower chips 150 and 160 may include memory chips.

The first lower chip 150 may include a plurality of first lower pads 152. The first lower pads 152 may be arranged on a lower surface of the first lower chip 150. The second lower chip 160 may include a plurality of second lower pads 162. The second lower pads 162 may be arranged on a lower surface of the second lower chip 160.

In example embodiments, the first lower chip 150 may have a size substantially the same as a size of the second lower chip 160. Further, the size of the first and second lower chips 150 and 160 may be substantially the same as the size of the first and second upper chips 120 and 130.

The second lower chip 160 may be stacked on an upper surface of the first lower chip 150. That is, an upper surface of the second lower chip 160 may be configured to make contact with the lower surface of the first insulation layer 192. The first and second lower chips 150 and 160 may be stacked in the step-like shape in FIG. 2A or the pyramidal step-like shape in FIG. 2B. Thus, any further illustrations with respect to the stack structure of the first and second lower chips 150 and 160 may be omitted herein for brevity.

In example embodiments, the lower chip stack 170 may include the two stacked chips 150 and 160. Alternatively, the lower chip stack 170 may include at least three stacked chips.

A first lower post 172 may be downwardly extended from the first lower pads 152 of the first lower chip 150. The first lower post 172 may be formed by a plating process. In example embodiments, the first lower post 172 may include a metal such as copper.

A second lower post 174 may be downwardly extended from the second lower pads 162 of the second lower chip 160. The second lower post 174 may have a lower end substantially coplanar with a lower end of the first lower post 172. The second lower post 174 may be formed by a plating process. In example embodiments, the second lower post 174 may include a metal such as copper.

The redistribution post 200 may be downwardly extended from the lower end of the first redistribution pattern 190 in the fan-out region exposed through the lower surface of the first insulation layer 192. The redistribution post 200 may have a lower end substantially coplanar with the lower ends of the first and second lower posts 172 and 174. The redistribution post 200 may be formed by a plating process. The redistribution post 200 may include a metal such as copper.

The lower molding member 182 may be formed on the lower surface of the first insulation layer 192. Thus, the lower molding member 182 may be configured to surround the first and second lower chips 150 and 160 and the first and second lower posts 172 and 174. The lower ends of the first and second lower posts 172 and 174 and the lower end of the redistribution post 200 may be exposed through a lower surface of the lower molding member 182.

A second insulation layer 212 may be formed on the lower surface of the lower molding member 182. The second insulation layer 212 may include a PID. The second redistribution pattern 210 may be formed in the second insulation layer 212. The second redistribution pattern 210 may include an upper end exposed through an upper surface of the second insulation layer 212, and a lower end exposed through a lower surface of the second insulation layer 212. The lower ends of the first and second lower posts 172 and 174 and the lower end of the redistribution post 200 may be connected to the upper end of the second redistribution pattern 210 exposed through the upper surface of the second insulation layer 212.

In example embodiments, the second insulation layer 212 and the second redistribution pattern 210 may have a single-layered structure. Alternatively, the second insulation layer 212 and the second redistribution pattern 210 may have a multi-layered structure.

The external terminals 220 may be mounted on the lower ends of the second redistribution pattern 210 exposed through the lower surface of the second insulation layer 212. The external terminals 220 may include solder balls.

Further, a protection layer 230 may be formed on the upper surfaces of the frame 110 and the upper chip stack 140. The protection layer 230 may include an insulation layer such as epoxy resin. Additionally, a heat spreader may be arranged on an upper surface of the protection layer 230.

Figure 3:
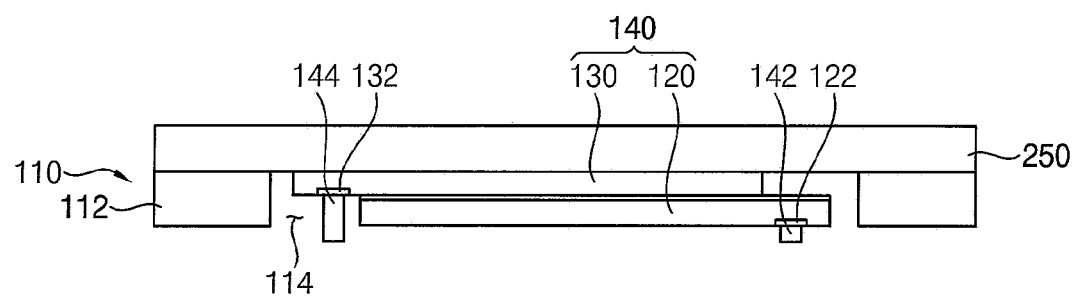
FIGS. 3 through 14 are cross-sectional views for reference in describing a method of manufacturing the semiconductor package shown in FIG. 1.
Figure 14:
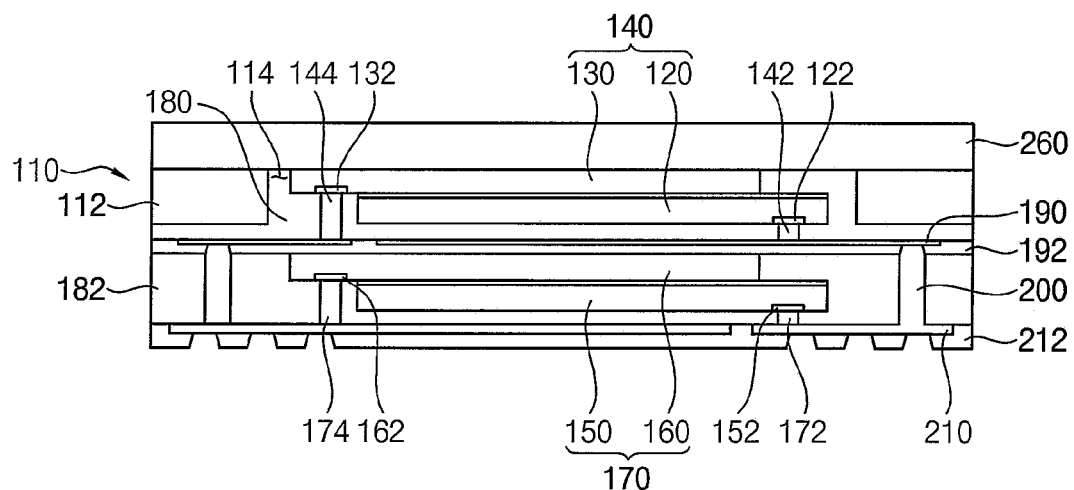

FIGS. 3 and 14 are cross-sectional views illustrating a method of manufacturing the semiconductor package in FIG. 1.

Referring to FIG. 3, the first and second upper chips 120 and 130 may be stacked in the step-like shape or the pyramidal step-like shape to form the upper chip stack 140. The first upper post 142 may be formed on the first upper pads 122 of the first upper chip 120 by the plating process. The second upper post 144 may be formed on the second upper pads 132 of the second upper chip 130 by the plating process. The first upper post 142 may have a length substantially the same as a length of the second upper post 144. Thus, the lower end of the first upper post 142 may be positioned on a plane lower than a plane where the lower end of the second upper post 144 may be positioned.

The upper chip stack 140 may be arranged in the cavity 114 of the frame 110 using a tape 250. Particularly, the tape 250 attached to the upper chip stack 140 may be attached to the upper surface of the frame 110 to position the upper chip stack 140 in the cavity 114 of the frame 110. The tape 250 may include polyimide.

Figure 4:
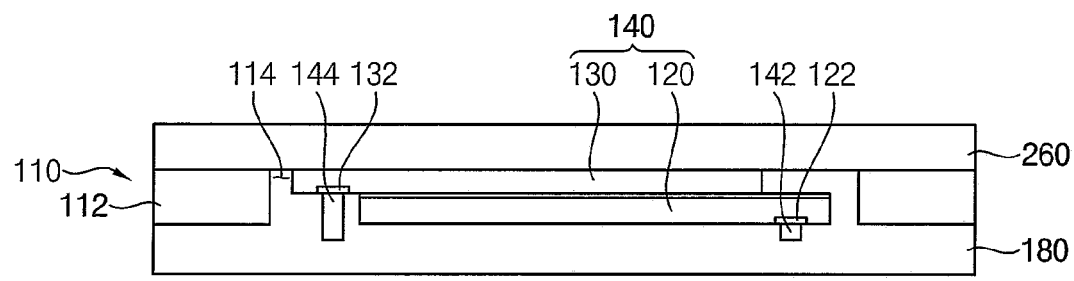

Referring to FIG. 4, after removing the tape 250, a carrier substrate 260 may be attached to the upper surface of the frame 110. The upper molding member 180 may be formed on the lower surface of the frame 110 to fill the cavity 114 with the upper molding member 180.

Figure 5:
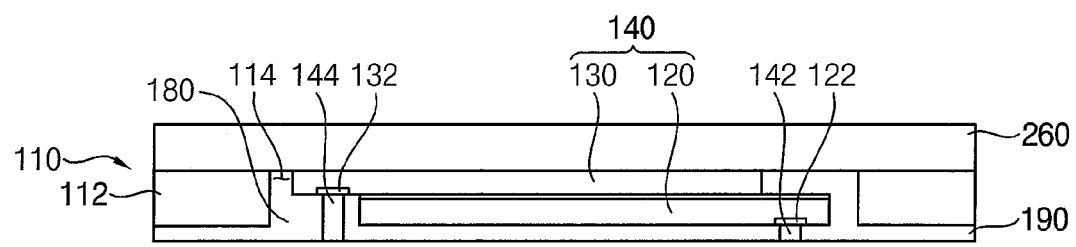

Referring to FIG. 5, the lower surface of the upper molding member 180 may be removed by a grinding process until the lower end of the second upper post 144 may be exposed. Because the lower end of the first upper post 142 may be lower than the lower end of the second upper post 144, the first upper post 142 may be partially removed by the grinding process. As a result, the lower ends of the first and second upper posts 142 and 144 may be exposed through the lower surface of the upper molding member 180.

Figure 6:
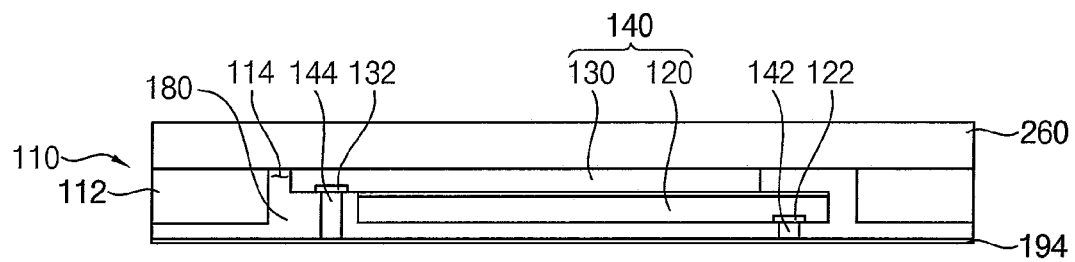

Referring to FIG. 6, a first redistribution layer (RDL) 194 may be formed on the lower surface of the upper molding member 180. The first RDL 194 may be connected to the lower ends of the first and second upper posts 142 and 144 exposed through the lower surface of the upper molding member 180.

Figure 7:
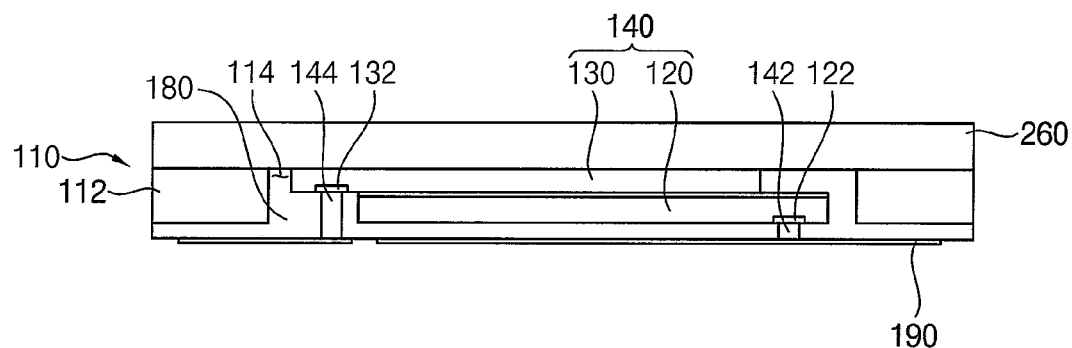

Referring to FIG. 7, the first RDL 194 may be etched to form the first redistribution pattern 190. The first redistribution pattern 190 may connected to the lower ends of the first and second upper posts 142 and 144.

Figure 8:
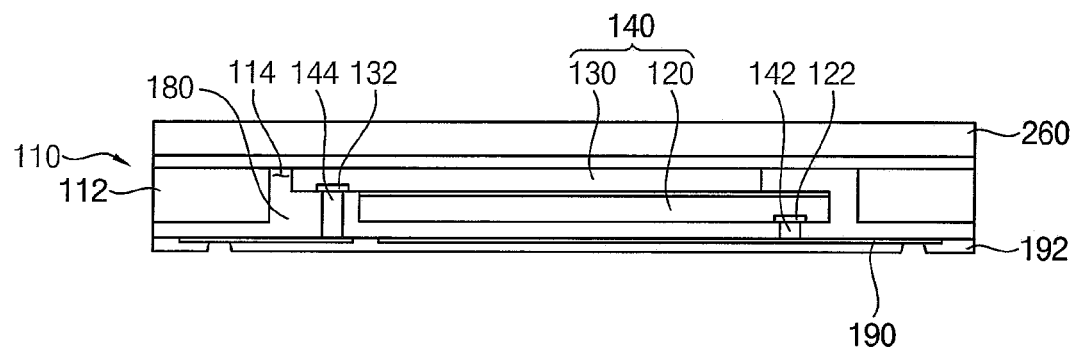

Referring to FIG. 8, the first insulation layer 192 may be formed on the lower surface of the upper molding member 180 to cover the first redistribution pattern 190 with the first insulation layer 192. The first insulation layer 192 may be patterned using an exposure process to expose the first redistribution pattern 190.

Figure 9:
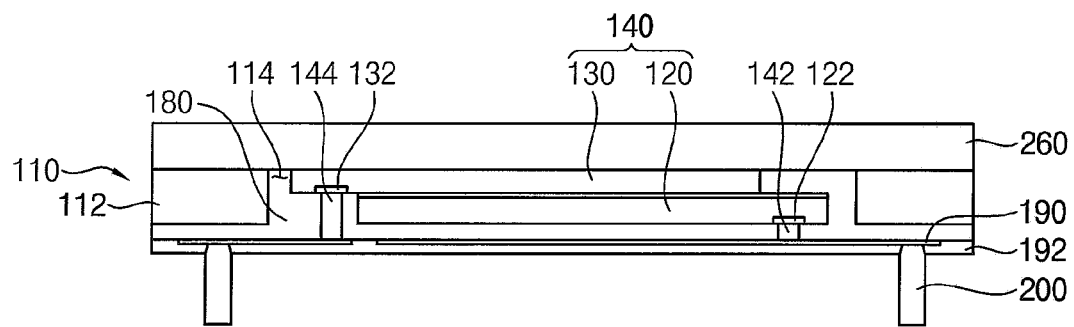

Referring to FIG. 9, the redistribution post 200 may be formed on the first redistribution pattern 190 exposed through the first insulation layer 192. The redistribution post 200 may be formed by the plating process.

Figure 10:
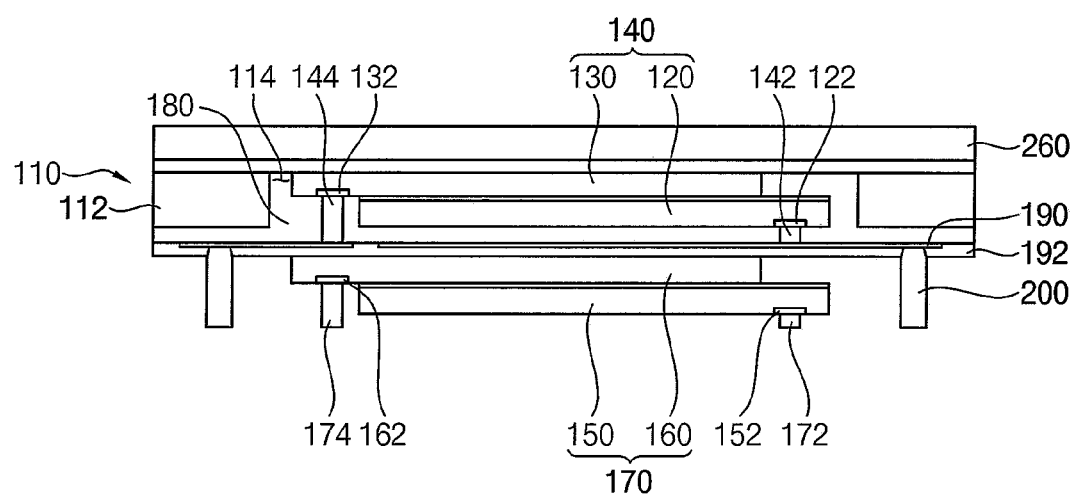

Referring to FIG. 10, the first and second lower chips 150 and 160 may be stacked in the step-like shape or the pyramidal step-like shape to form the lower chip stack 170. The first lower post 172 may be formed on the first lower pads 152 of the first lower chip 150 by the plating process. The second lower post 174 may be formed on the second lower pads 162 of the second lower chip 160 by the plating process. The first lower post 172 may have a length substantially the same as a length of the second lower post 174. Thus, the lower end of the first lower post 172 may be positioned on a plane lower than a plane where the lower end of the second lower post 174 may be positioned.

The lower chip stack 170 may be attached to the lower surface of the first insulation layer 192. That is, the upper surface of the second lower chip 160 in the lower chip stack 170 may be attached to the lower surface of the first insulation layer 192.

Figure 11:
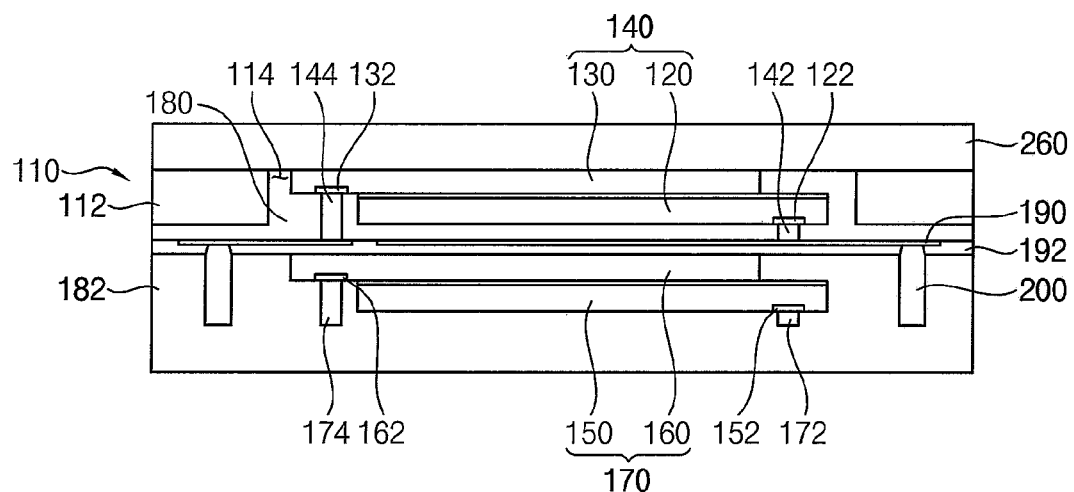

Referring to FIG. 11, the lower molding member 182 may be formed on the lower surface of the first insulation layer 192 to cover the lower chip stack 170, the first and second lower posts 172 and 174 and the redistribution post 200 with the lower molding member 182.

Figure 12:
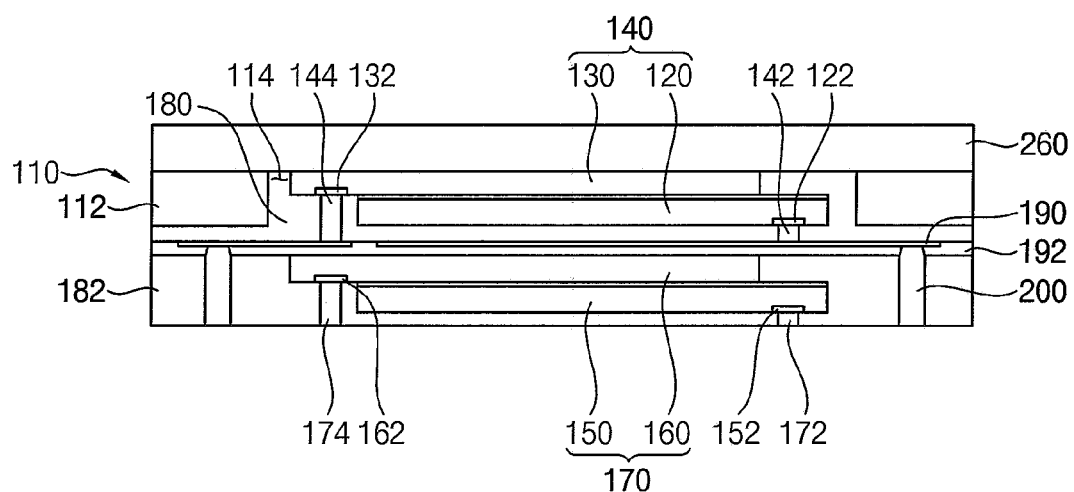

Referring to FIG. 12, the lower surface of the lower molding member 182 may be removed by a grinding process until the lower end of the second lower post 174 may be exposed. Because the lower end of the first lower post 172 may be lower than the lower end of the second lower post 174, the first lower post 172 may be partially removed by the grinding process. As a result, the lower ends of the first and second lower posts 172 and 174 and the lower end of the redistribution post 200 may be exposed through the lower surface of the lower molding member 182.

Figure 13:
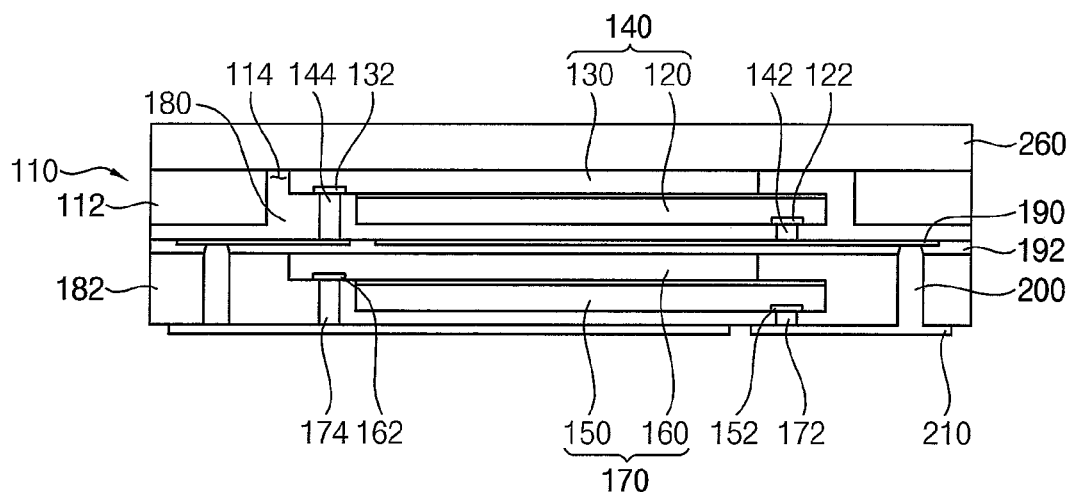

Referring to FIG. 13, a second RDL may be formed on the lower surface of the lower molding member 182. The second RDL may be etched to form the second redistribution pattern 210. The second redistribution pattern 210 may connected to the lower ends of the first and second lower posts 172 and 174 and the lower end of the redistribution post 200.

Referring to FIG. 14, the second insulation layer 212 may be formed on the lower surface of the lower molding member 182 to cover the second redistribution pattern 210 with the second insulation layer 212. The second insulation layer 212 may be patterned using an exposure process to expose the second redistribution pattern 210.

After removing the carrier substrate 260, a protection layer 230 may be formed on the upper surface of the frame 110. The external terminals 220 may be mounted on the second redistribution pattern 210 to complete the fan-out type semiconductor package 100 in FIG. 1.

Figure 15:
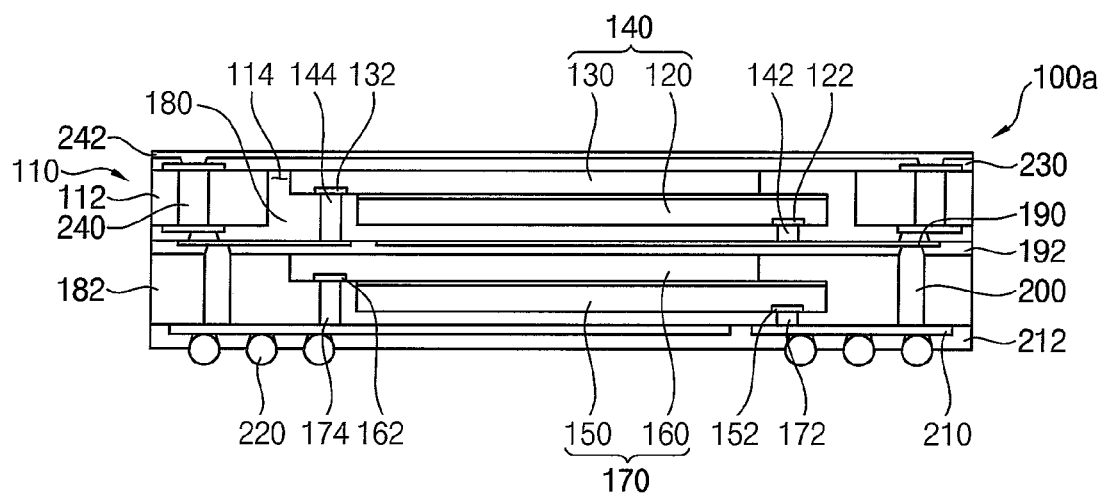
FIG. 15 is a cross-sectional view illustrating a fan-out type semiconductor package in accordance with example embodiments.
Figure 16:
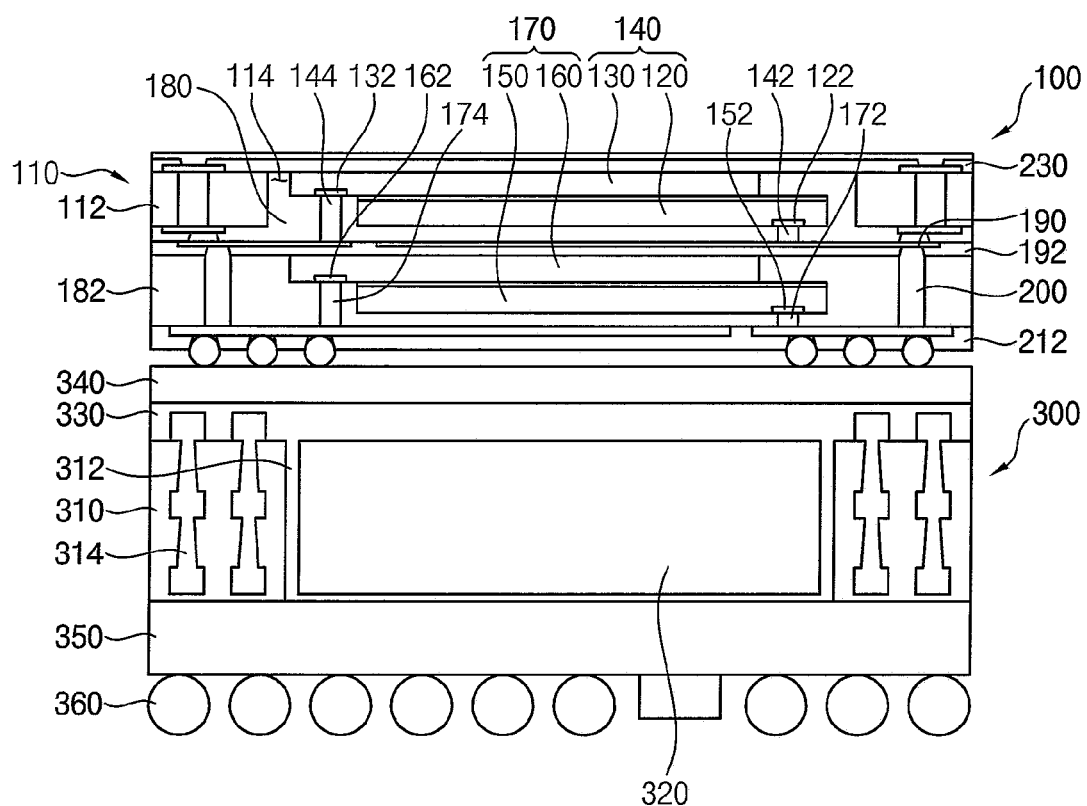
FIG. 16 is a cross-sectional view illustrating a package including a logic chip connected with the fan-out type semiconductor package shown in FIG. 15.

FIG. 15 is a cross-sectional view illustrating a fan-out type semiconductor package in accordance with example embodiments, and FIG. 16 is a cross-sectional view illustrating a package including a logic chip connected with the fan-out type semiconductor package in FIG. 15.

A fan-out type semiconductor package 100a of example embodiments may include elements substantially the same as those of the fan-out type semiconductor package 100 in FIG. 1 except for further including a frame post and a wiring. Thus, the same reference numerals may refer to the same elements and any further illustrations with respect to the same elements may be omitted herein for brevity.

Referring to FIG. 15, a frame post 240 may be arranged in the frame 110. Particularly, the frame post 240 may be vertically arranged in the core insulation layer 112 of the frame 110.

The frame post 240 may include an upper end exposed through the upper surface of the protection layer 230. The frame post 240 may include a lower end connected to the first redistribution pattern 190. Thus, the frame post 240 may be electrically connected with the external terminals 220 via the first redistribution pattern 190, the redistribution post 200 and the second redistribution pattern 210.

The wiring 242 may be formed on the upper surface of the protection layer 230. The wiring 242 may be connected to the upper end of the frame post 240. Thus, the wiring 242 may be electrically connected to the external terminals 220 via the frame post 240, the first redistribution pattern 190, the redistribution post 200 and the second redistribution pattern 210.

Referring to FIG. 16, when a package 300 including a logic chip 320 may be arranged under the fan-out type semiconductor package 100a, heat generated from the logic chip 320 may be transferred to the frame post 240 and the wiring 242 through the external terminals 220, the second redistribution pattern 210, the redistribution post 200 and the first redistribution pattern 190. Thus, the heat may be rapidly dissipated from the fan-out type semiconductor package 100a. As a result, the frame post 240 and the wiring 242 may function as a heat dissipation path.

The package 300 may include a frame 310, the logic chip 320, an insulation layer 330, an upper conductive layer 340, a lower conductive layer 350 and external terminals 360. The logic chip 320 may be arranged in a cavity 312 of the frame 310. The frame 310 may include a post 314.

The insulation layer 330 may be formed on an upper surface of the frame 310 to fill up the cavity 312. The upper conductive layer 340 may be formed on an upper surface of the insulation layer 330 to electrically connect the logic chip 320 with the external terminals 220 of the fan-out type semiconductor package 100. The lower conductive layer 350 may be formed on a lower surface of the frame 310. The lower conductive layer 350 may be electrically connected with the post 314. The external terminals 360 may be mounted on the lower conductive layer 350.

However, the logic chip 320 may be applied to other packages as well as the above-mentioned package 300.

Figure 17:
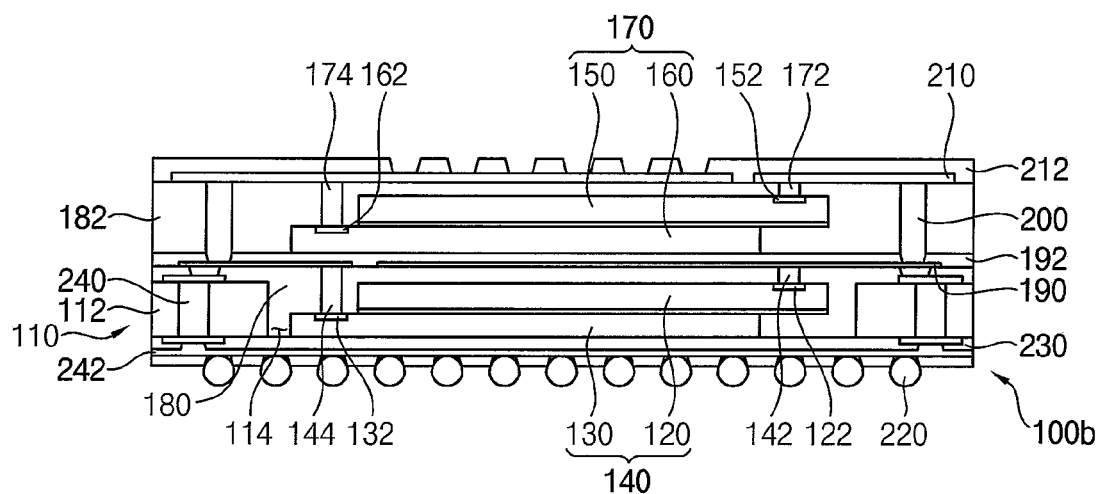
FIG. 17 is a cross-sectional view illustrating a fan-out type semiconductor package in accordance with example embodiments.
Figure 18:
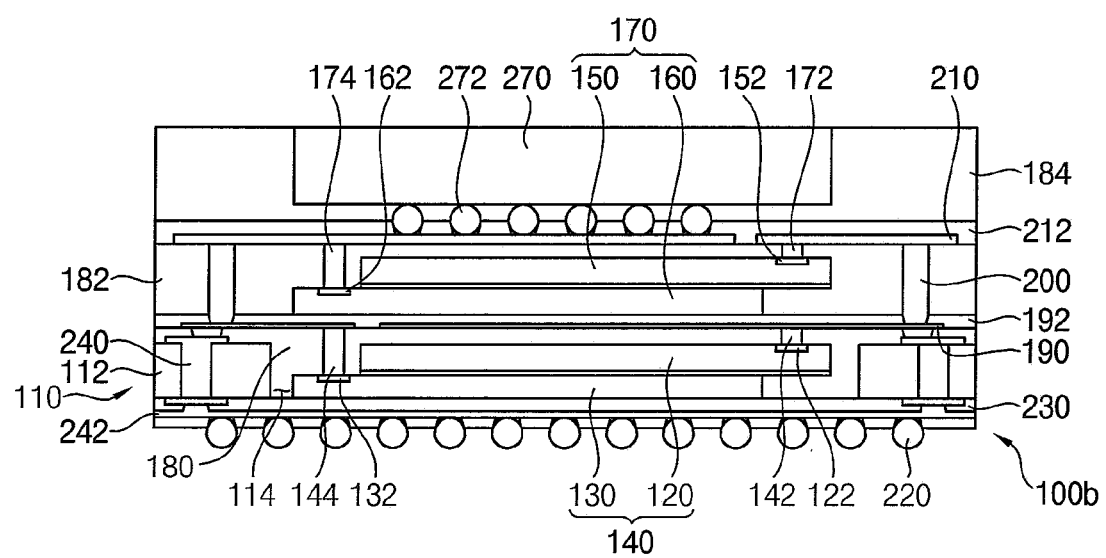
FIG. 18 is a cross-sectional view illustrating a logic chip applied to the fan-out type semiconductor package shown in FIG. 17.

FIG. 17 is a cross-sectional view illustrating a fan-out type semiconductor package in accordance with example embodiments, and FIG. 18 is a cross-sectional view illustrating a logic chip applied to the fan-out type semiconductor package in FIG. 17.

Referring to FIG. 17, a fan-out type semiconductor package 100b of example embodiments may be formed by reversing the fan-out type semiconductor package 100a in FIG. 15. Thus, the lower chip stack 170 may be positioned over the upper chip stack 140. Further, the second redistribution pattern 210 may correspond to an uppermost layer of the fan-out type semiconductor package 100b. The wiring 242 may correspond to a lowermost layer of the fan-out type semiconductor package 100b. The external terminals 220 may be mounted on the wiring 242.

Referring to FIG. 18, a logic chip 270 may be connected with the second redistribution pattern 210 via conductive bumps 272. A molding member 184 may be formed on the upper surface of the second insulation layer 212 to cover the logic chip 270. However, the fan-out type semiconductor package 100b may not include the molding member 184.

According to example embodiments, the upper chip stack may be arranged in the cavity of the frame in the step-like shape and the step-like lower chip stack may also be arranged under the upper chip stack. Thus, the fan-out type semiconductor package may have improved heat dissipation characteristic with a thin thickness.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a fan-out type semiconductor package, the method comprising:
   arranging an upper chip stack in a cavity of a frame;
   forming a first redistribution pattern under the frame, the first redistribution pattern electrically connected with the upper chip stack;
   arranging a lower chip stack under the first redistribution pattern;
   forming a second redistribution pattern under the lower chip stack, the second redistribution pattern electrically connected with the lower chip stack; and
   electrically connecting the first redistribution pattern and the second redistribution pattern with each other using a redistribution post,
   wherein arranging the upper chip stack in the cavity comprises stacking a second upper chip, which has a size substantially the same as a size of a first upper chip, on an upper surface of the first upper chip in a step-like shape to expose a first upper pad on an edge portion of the first upper chip, which is not overlapped with the second upper chip, and to expose a second upper pad on an edge portion of the second upper chip, which is not overlapped with the first upper chip.

2. The method of claim 1, wherein electrically connecting the upper chip stack with the first redistribution pattern comprises:
   downwardly extending a first upper post from the first upper pad, the first upper post connected to the first redistribution pattern; and
   downwardly extending a second upper post from the second upper pad, the second upper post connected to the first redistribution pattern.

3. The method of claim 1, wherein arranging the upper chip stack in the cavity comprises stacking the second upper chip on the upper surface of the first upper chip in a pyramidal step-like shape to expose two adjacent edge portions of the first upper chip, which are not overlapped with the second upper chip, and to expose two adjacent edge portions of the second upper chip, which are not overlapped with the first upper chip.

4. The method of claim 1, wherein arranging the lower chip stack under the first redistribution pattern comprises stacking a second lower chip, which has a size substantially the same as a size of a first lower chip, on an upper surface of the first lower chip in a step-like shape to expose a first lower pad on an edge portion of the first lower chip, which is not overlapped with the second lower chip, and to expose a second lower pad on an edge portion of the second lower chip, which is not overlapped with the first lower chip.

5. The method of claim 4, wherein electrically connecting the lower chip stack with the second redistribution pattern comprises:
   downwardly extending a first lower post from the first lower pad, the first lower post connected to the second redistribution pattern; and
   downwardly extending a second lower post from the second lower pad, the second lower post connected to the second redistribution pattern.

6. The method of claim 3, wherein arranging the upper chip stack in the cavity comprises stacking the second lower chip on the upper surface of the first lower chip in a pyramidal step-like shape to expose two adjacent edge portions of the first lower chip, which are not overlapped with the second lower chip, and to expose two adjacent edge portions of the second lower chip, which are not overlapped with the first lower chip.

7. The method of claim 1, further comprising:
arranging a frame post in the frame and electrically connected with the redistribution post; and
arranging a wiring, which is electrically connected with the frame post, over the frame.

8. The method of claim 7, further comprising:
arranging an external terminal on the wiring; and
arranging a logic chip on the second redistribution pattern.

9. The method of claim 1, further comprising:
arranging an upper molding member on the first redistribution pattern to support the upper chip stack; and
arranging a lower molding member on the second redistribution pattern to support the lower chip stack.

* * * * *